United States Patent
Brown et al.

(10) Patent No.: US 6,609,077 B1
(45) Date of Patent: Aug. 19, 2003

(54) ATE TIMING MEASUREMENT UNIT AND METHOD

(75) Inventors: Benjamin Brown, Lake Oswego, OR (US); Erik V. Hultine, Aloha, OR (US); John Robert Pane, Tigard, OR (US); Andrew Damian Firth, Portland, OR (US); Chiyi Jin, Thousand Oaks, CA (US); Binwei Yang, Thousand Oaks, CA (US)

(73) Assignee: Teradyne, Inc., Boston, MA (US)

( * ) Notice: Subject to any disclaimer, the term of this patent is extended or adjusted under 35 U.S.C. 154(b) by 110 days.

(21) Appl. No.: 09/584,636

(22) Filed: May 31, 2000

(51) Int. Cl.[7] .............................................. G01R 27/28
(52) U.S. Cl. ...................... 702/117; 702/159; 702/108; 702/119; 714/700
(58) Field of Search ............................. 324/76.38, 533, 324/617, 76.44, 76.68, 158.1, 73.1; 368/113; 702/108, 159, 117, 119; 714/700, 724, 735, 738, 744

(56) References Cited

U.S. PATENT DOCUMENTS

| | | |
|---|---|---|
| 4,703,448 A | 10/1987 | Muething, Jr. |
| 4,792,932 A | 12/1988 | Bowhers et al. |
| 5,058,087 A | 10/1991 | Welzhofer |
| 5,225,775 A | 7/1993 | Sekino |
| 5,256,964 A | 10/1993 | Ahmed et al. |
| 5,321,632 A * | 6/1994 | Otsuji .......................... 364/562 |
| 5,539,305 A | 7/1996 | Botka |
| 5,604,751 A * | 2/1997 | Panis .......................... 371/22.1 |
| 5,609,489 A | 3/1997 | Bickford et al. |
| 5,703,489 A | 12/1997 | Kuroe |
| 5,809,034 A | 9/1998 | Rezvani et al. |
| 5,811,655 A | 9/1998 | Hashimoto et al. |
| 5,931,962 A | 8/1999 | Dang |

FOREIGN PATENT DOCUMENTS

EP 736773 10/1996 .......... G01R/29/02

OTHER PUBLICATIONS

Tai–ichi Otsuji; "A Picosecond–Accuracy, 700–MHz Range, Si–Bipolar Time Interval Counter LSI"; IEEE Journal of Solid–State Circuits, vol. 28, No. 9, Sep. 1993.

Analog Devices Inc. Specification for "Ultrahigh Speed Phase/Frequency Discriminator", 1999.

Richard Feldman; A Novel Instrument For Accurate Time Measurement in Automatic Calibration of Test Systems; ITC Paper 24.1; 1993.

C.R. Saikley and Rick Muething; "A Rapid, Low–Cost Technique For Precise AC Calibration in a Focused ASIC Tester"; ITC Paper 32.1; 1987.

Tai–ichi Otsuji; "A Picosecond Accuracy Timing Error Compensation Technique in TDR Measurement"; ITC Paper; 1991.

Andrew Yang and Yu–Hsu Chang; "Physical Timing Modeling for Bipolar VLSI"; IEEE Journal of Solid–State Circuits, vol. 27, No. 9, Sep. 1992.

\* cited by examiner

*Primary Examiner*—John Barlow
*Assistant Examiner*—Stephen J. Cherry
(74) *Attorney, Agent, or Firm*—Lance M. Kreisman

(57) ABSTRACT

Automatic test equipment is disclosed for testing a semiconductor device and including a computer workstation and pin electronics circuitry coupled between the semiconductor device and the computer. The pin electronics circuitry includes a plurality of channels, each channel having timing circuitry operative in response to desired programmed timing information, driver/comparator circuitry coupled to the timing circuitry for driving test waveforms at a period T, and sampling data from the waveforms at a beat period $T +/- \Delta t$, and a timing measurement unit. The timing measurement unit is coupled to the driver/comparator circuitry for measuring the relative timings of the sampled data. The plurality of channels cooperate to produce substantially real-time timing measurement data in parallel.

12 Claims, 6 Drawing Sheets

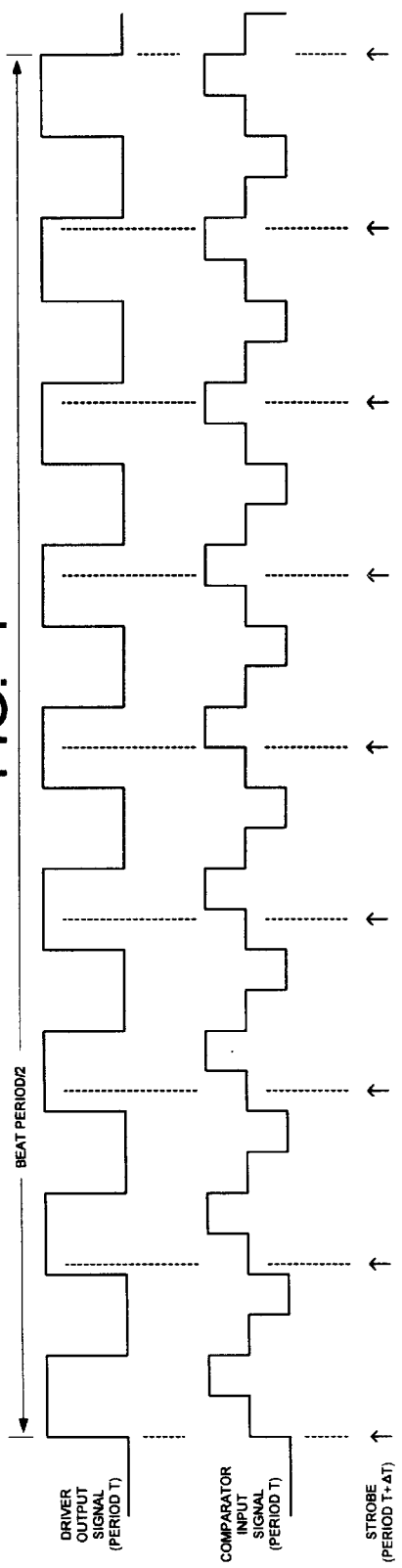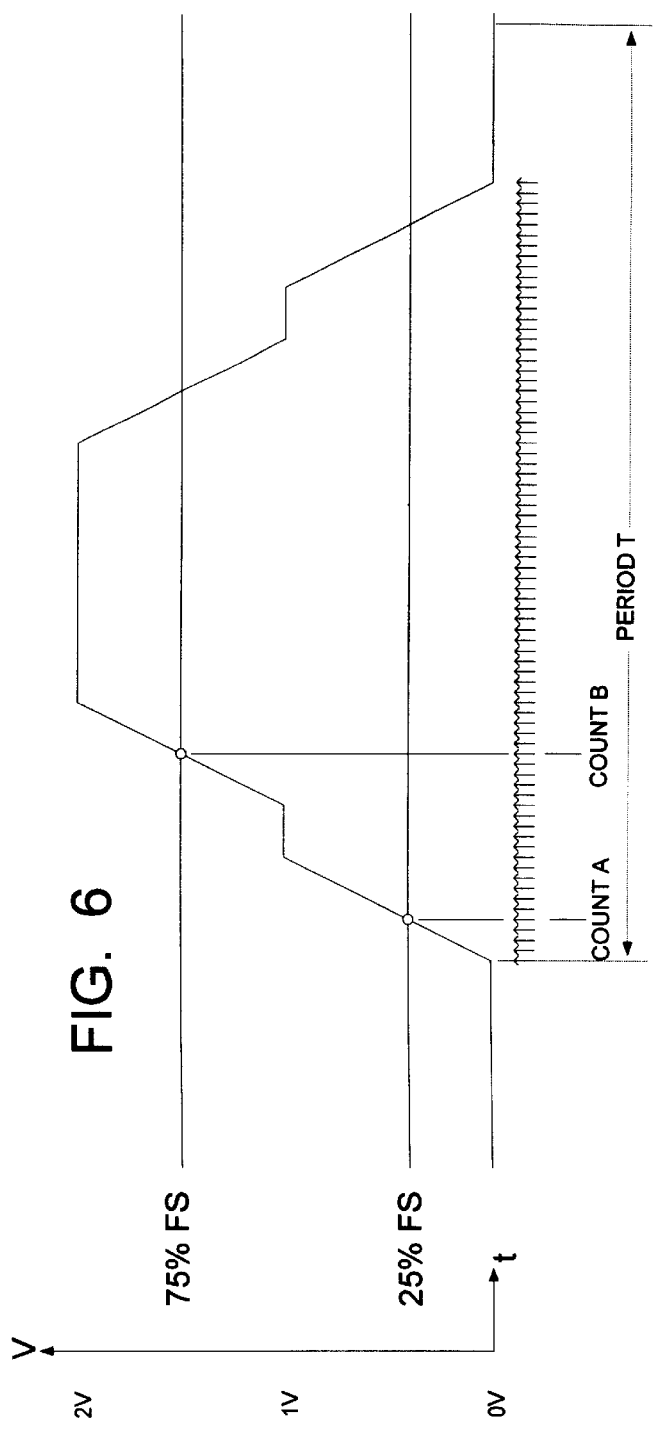

ATE TIMING MEASUREMENT UNIT AND METHOD

FIELD OF THE INVENTION

The invention relates generally to automatic test equipment and more particularly a timing measurement unit and method for collecting timing information.

BACKGROUND OF THE INVENTION

Automatic test equipment allows semiconductor device manufacturers to test, in volume, the functionality of each device sold in the marketplace. The equipment, often referred to as a tester, generally drives signals to and detects signals from a device-under-test (DUT), and evaluates the detected results to expected values.

Modern semiconductor devices often have between hundreds to thousands of pins that receive and send a variety of input/output signals. Consequently, one of the basic challenges confronting a tester involves synchronizing the application or detection of signals from a plurality of DUT pins at relatively precise timings. Synchronizing high-speed test signals often requires some form of calibration technique to compensate for a variety of signal degrading factors associated with each tester channel. Two of the more common methods of performing timing calibration include time-domain-reflectometry (TDR) and vernier linearity calibration.

Conventional TDR techniques generally involve determining a transmission line length, and predicting the signal delay caused by the line. The length is often calculated by driving a pulse down the open-ended line, detecting the reflection, and measuring the relative timings between the two events. A more thorough explanation of the conventional technique is found in U.S. Pat. No. 5,321,632, to Otsuji.

Vernier linearity calibration refers to characterizing the actual edge timings of a timing vernier in response to predefined delay settings. Conventionally, this was done one channel at a time using a large control matrix of relays, ECL gates, etc., and centrally controlled by mainframe-resident hardware. During the characterizing process, data results for each channel were fed back to the hardware one-by-one. While such a technique works well for its intended applications, the dramatic rise in device pin counts (and tester channel counts) renders such a sequential methodology undesirable in terms of calibration process time and reliability.

What is needed and heretofore unavailable is a timing measurement unit and method for carrying out timing measurements quickly and accurately. The walking strobe calibration apparatus and method satisfies these needs.

SUMMARY OF THE INVENTION

The timing measurement unit and associated methods of the present invention provide high accuracy tester timing data acquisition and processing especially useful for calibration applications to minimize calibration process time. This correspondingly results in higher tester accuracy, higher tester performance and lower test costs for semiconductor manufacturers.

To realize the foregoing advantages, the invention in one form comprises automatic test equipment for testing a semiconductor device and including a computer workstation and pin electronics circuitry coupled between the semiconductor device and the computer. The pin electronics circuitry includes a plurality of channels, each channel having timing circuitry operative in response to desired programmed timing information, driver/comparator circuitry coupled to the timing circuitry for driving test waveforms at a period T, and sampling data from the waveforms at a beat period T +/−Δt, and a timing measurement unit. The timing measurement unit is coupled to the driver/comparator circuitry for measuring the relative timings of the sampled data. The plurality of channels cooperate to produce substantially real-time timing measurement data in parallel.

In another form, the invention comprises a real-time results processor for implementation in a semiconductor tester pin electronics channel for detecting actual timing data relating to test waveforms having a period T generated by a semiconductor tester. The real-time results processor includes input circuitry having a clock input for receiving a stream of data values sampled from the test waveforms at the beat period. The processor also includes a data filter coupled to the input circuitry and having logic responsive to preprogrammed criteria to extract data indicative of a timing event. A counter operative to count the data values and generate a count representative of the timing of the extracted timing event data with respect to a predetermined reference count. Storage circuitry stores the count.

In yet another form, the invention comprises a method of determining the length of a transmission line. The method includes the steps of first driving a periodic waveform of a predetermined magnitude along the transmission line at a predetermined period (T) to generate a periodic sequence of incidence edges and reflected edges. A comparator detection threshold is then set at a specified level to detect the incidence edges. The waveform is strobed, or sampled, at a strobe period (T +/−Δt). The strobe period and the waveform period cooperate to define a beat period. A timing reference point is then established on the waveform. Once the timing reference point is established, one of the incidence edges is detected at an incidence edge detection point in a first search. A count of the number of strobes from the timing reference point to the incidence edge detection point is recorded. To maintain the timing reference point, the count is reset at the beat period rate. The method continues by detecting the reflected edge in a subsequent search and recording a count of the number of strobes from the timing reference point to the reflected edge detection point. Once the count for the reflected edge is made, the method concludes by evaluating the relative counts between the incidence edge detection point and the reflected edge detection point to determine the length of the transmission line.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which

FIGS. 4 and 5 are graphical illustrations showing the operation of the timing measurement unit hardware during TDR data collection;

FIGS. 6A and 6B are further graphical illustrations showing the data collection and processing operations of the real-time results processor for TDR applications.

DETAILED DESCRIPTION OF THE INVENTION

Figure 1:
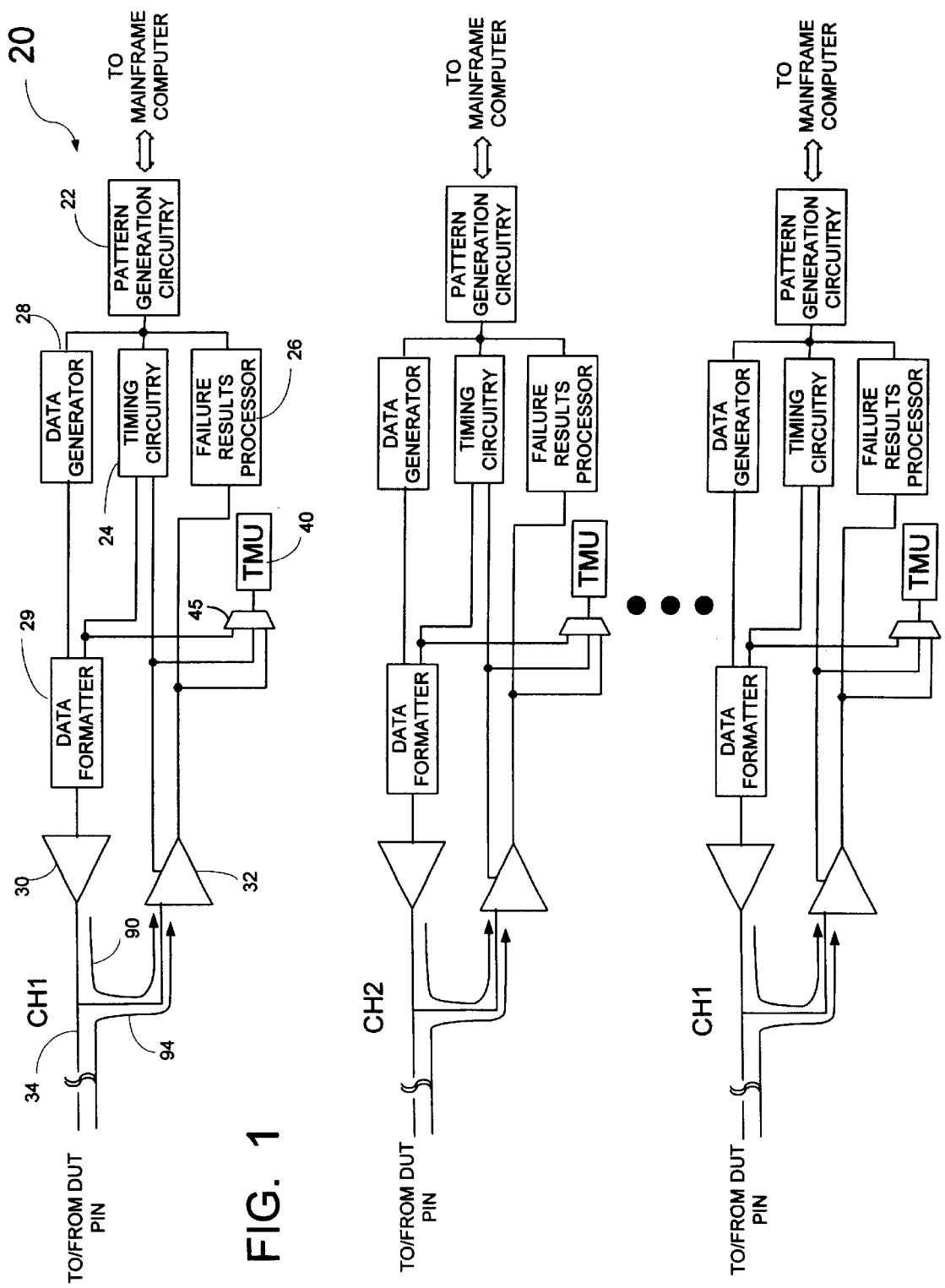
FIG. 1 is a high-level block diagram schematic of a channel architecture implementation according to one embodiment of the present invention.

Referring now to FIG. 1, automatic test equipment 20 according to one form of the present invention includes a plurality of semiconductor tester channels CH1, CH2 and CHN, for interfacing a tester computer workstation (not shown) to a plurality of device-under-test (DUT) pins (not shown). Each tester channel includes pattern generation circuitry 22 that feeds vectors to timing circuitry 24, a failure results processor 26 and a data generator 28, as is well known in the art. A driver circuit 30 and comparator circuit 32 within each channel apply signals to and detect signals from the DUT along a transmission line 34 in accordance with precisely timed events from the pattern generation and timing circuitry. A data formatter 29 generates driver input waveforms for the driver circuit based on the data and timing information from the data generator and the timing circuitry. To ensure that the precision timing is in fact within desired tolerances, a timing measurement unit (TMU), generally designated 40, is implemented in each channel to minimize data collection delays for the plurality of channels.

Figure 2:
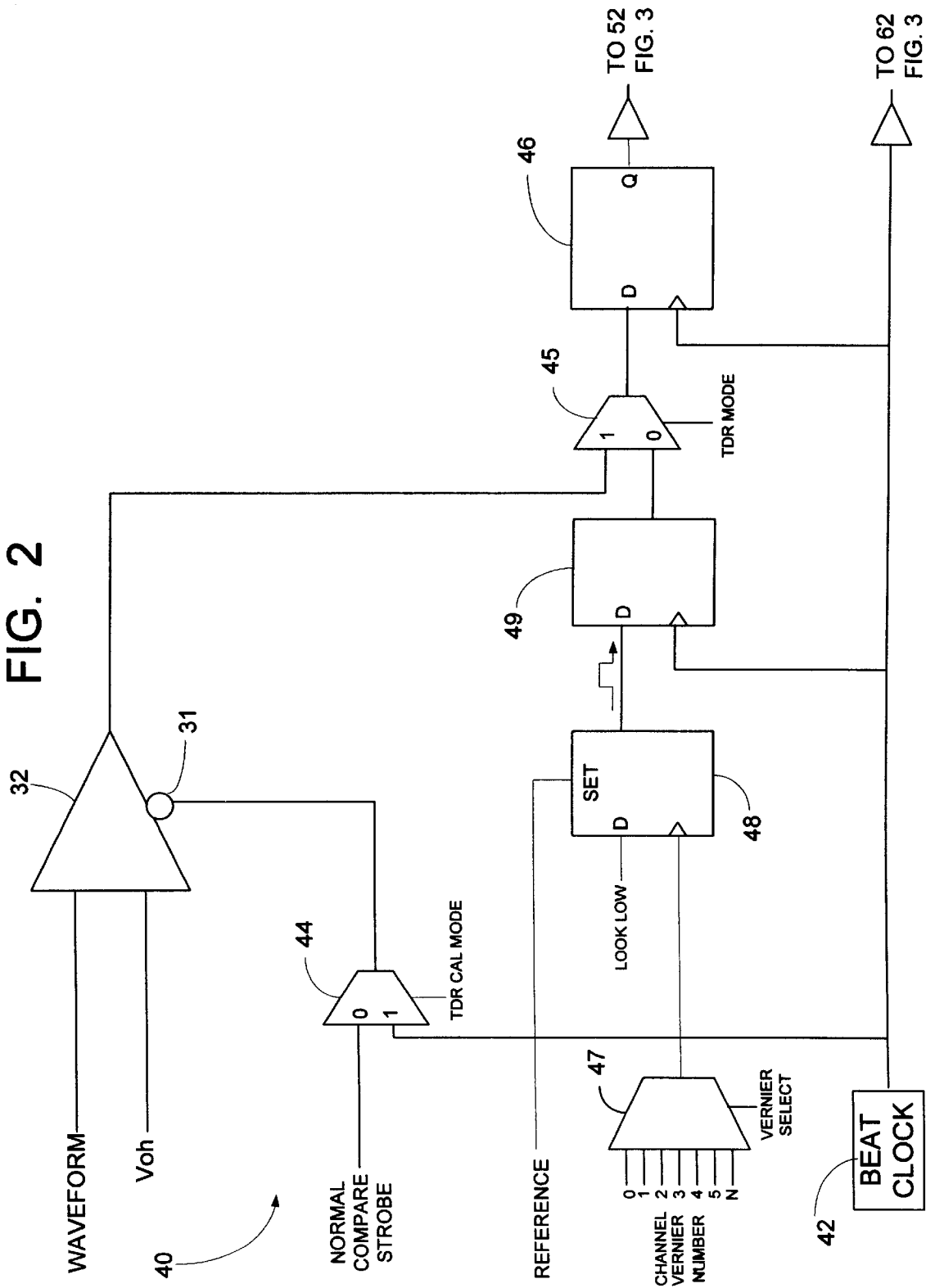
FIG. 2 is a partial block diagram schematic of the timing measurement unit hardware according to one embodiment of the present invention.
Figure 3:
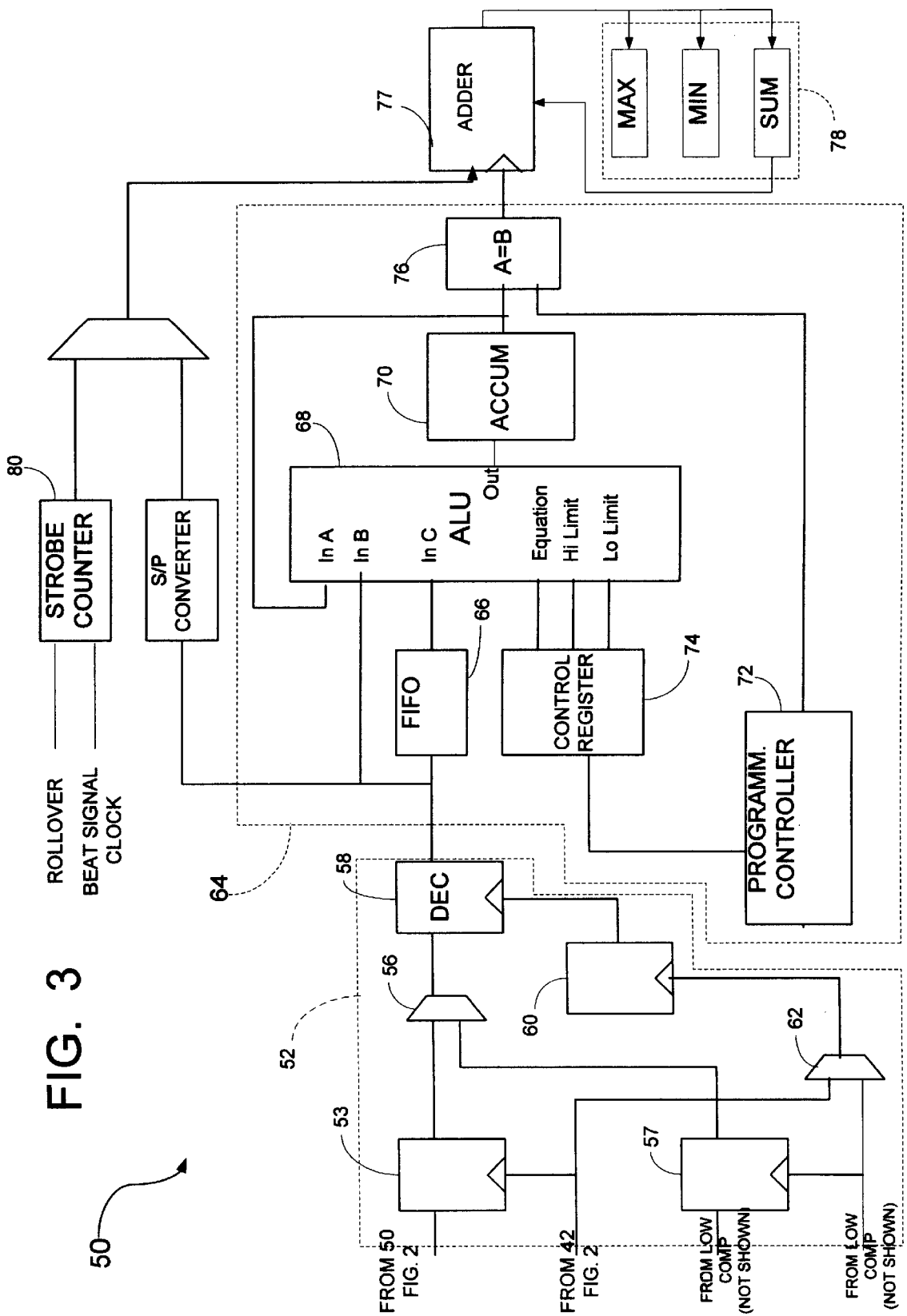
FIG. 3 is a block diagram schematic of the real-time results processor hardware associated with the timing measurement unit of FIG. 1.

With reference to FIGS. 2 and 3, the timing measurement unit 40, according to one form of the invention, includes hardware capable of selectively receiving timing measurement signals from a tester channel to measure the associated transmission line length and/or linearize the channel timing circuitry. By knowing the length of the transmission line and/or the characteristics of the timing circuitry in response to changing variables to a high degree of accuracy, delays along the line can be calibrated out with a corresponding high degree of accuracy and predictibility.

Further referring to FIG. 2, the timing measurement unit 40 cooperates with the comparator circuitry 32 and includes hardware to selectively acquire TDR data or timing vernier characterization data. For purposes of clarity, only one comparator (high) is shown, but preferably a dual comparator construction is employed, one high and one low. One of the basic components of the TMU involves the use of a "beat clock" 42 that is slightly offset from the measured waveform by, for example a picosecond, resulting in the beat clock "walking" through the waveform over a succession of cycles in picosecond increments.

For TDR applications, the TMU hardware further includes a first selector 44 that passes either the beat clock signal or a normal strobe signal to the strobe input 31 of the comparator 32. A second selector 45 passes the sampled TDR data to the "D" input of an output flip-flop 46 also clocked by the beat clock 42.

For timing vernier linearization data collection, a vernier selector 47 is employed to pass a vernier signal to the clock input of a first measurement flip-flop 48. A fixed rising edge reference is fed to the SET input of the flip-flop such that a pulse is created at the output. The pulse is clocked through a second flip-flop 49 for added timing stability, and in linearization mode, passed through to the output flip-flop 46.

Referring now to FIG. 3, the output flip-flop data (from 46) is fed to a real-time results processor 50 especially suited for calibration-type data processing. Generally, the real-time results processor includes input circuitry 52 that feeds a data filter 64, a counter circuit 80, and a plurality of registers 78. The input circuitry includes an input register 53 clocked by the beat signal clock 42. The output from the register is fed along a data path through a first multiplexer 56 to a decimator stage 58. The decimator stage is clocked by a programmable divider 60, that in turn, is clocked by a selected clock signal from a second multiplexer 62. A second register 57 is shown that corresponds to data from the low comparator circuitry (not shown).

With further reference to FIG. 3, the output of the decimator 58 couples to the data filter 64 that generally comprises a first-in-first-out unit (FIFO) 66 and an arithmetic logic unit (ALU) 68. The ALU includes a plurality of inputs A, B and C, for receiving "current value", post-decimated data, and FIFO output signals, respectively. The output of the ALU 68 feeds an accumulator 70. Control of the ALU is accomplished by a programmable controller 72 that drives a control register 74. The ALU receives control signals from the control register that are coded to provide equation, hi limit and low limit instructions. The controller 72 and the output of the accumulator 70 generate a "results output" at an output register 76.

The output of the data filter, the "results output", provides a signal for clocking data through a register 77 for selective storage in the storage registers 78. The data input of the memory couples to the output of the counter circuit 80 that monitors the number of beat clock pulses from a preset reference. The counter includes inputs that receive the beat signal clock and a programmed "rollover" threshold from the mainframe computer to reset the counter in TDR measurement applications. The storage registers take the form of a limited depth count stack that maintains a running sum location SUM, and respective minimum and maximum value locations MIN and MAX.

In operation, the timing measurement unit 40 for each channel may be used, in one application, to carry out a time-domain-reflectometry (TDR) measurement to determine the length of the channel transmission line with very high accuracy.

Generally, as illustrated in FIG. 1 for channel 1 CHN1, the measurement technique involves driving an incident edge from the output of the driver 30 directly to the comparator 32 along a first switching path 90. The edge also propagates from the driver output along the transmission line 34. The open-ended line causes the incident edge to reflect and propagate as a reflected edge along a third path 94 to one of the inputs to the comparator 32. While the general steps noted above are commonly known in the art, the beneficial way that the timing measurement unit of the present invention carries out its data collection to render a high accuracy TDR measurement with minimal process time is more fully described below.

FIG. 4 illustrates the relationship of a train of driver pulses at a predetermined period T and the resulting waveform feeding the comparator. Although the driver 30 is set to "fire" at the previously noted period T, the periodicity of the comparator strobe signal (shown as an 1), which enables the comparator 32 to capture or sample data, is offset slightly to (T+Δt) or (T−Δt). Thus, for each subsequent driver pulse, the strobe signal will occur at a slightly different point in relative time. Over a predictable duration, the incident edge and the strobe will is coincide over a regular period, defining what is commonly known as a "beat period". The inventor has discovered that by resetting the strobe counter 80 at the beat period rate, a highly accurate TDR measurement may be accomplished.

To further illustrate the TDR method of the present invention, FIG. 6 shows a single TDR waveform, having a period of, for example 100.000 nanoseconds. As shown, several cycles worth of strobes at a slightly offset period of 100.0005 ns have "walked through" the waveform (strobe signal indications not to scale). Count A is the detected strobe count with the programmed comparator threshold at 25% full-scale, while count B is the strobe count with the comparator threshold at 75% full-scale. However, since it takes a finite time to move the comparator threshold from 25% to 75%, the relative counts are useful only if they're referenced to the same reference point. Rather than reference the events to the same point in time, the inventor has referenced the events to the same relative point on each waveform, with the counter rolling over at the same point on each waveform cycle. Consequently, the difference in count values between A and B indicates the propagation time attributable to the transmission line length. With this information, the tester can calibrate the delay due to transmission line distance out during actual device testing.

Figure 5A:
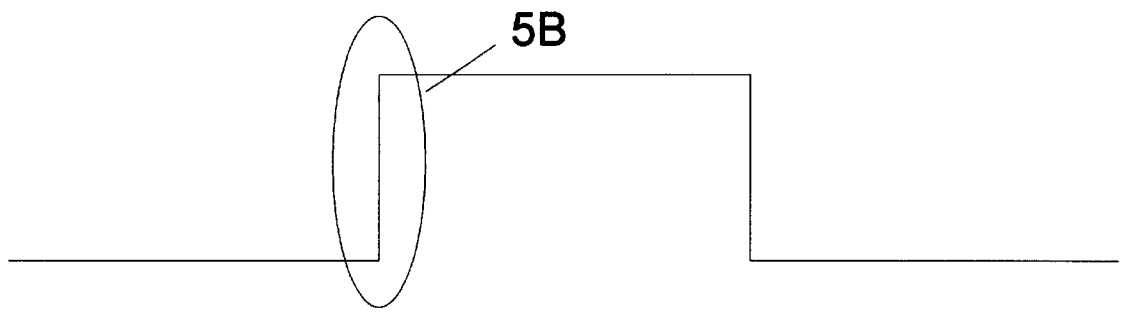
Figure 5B:
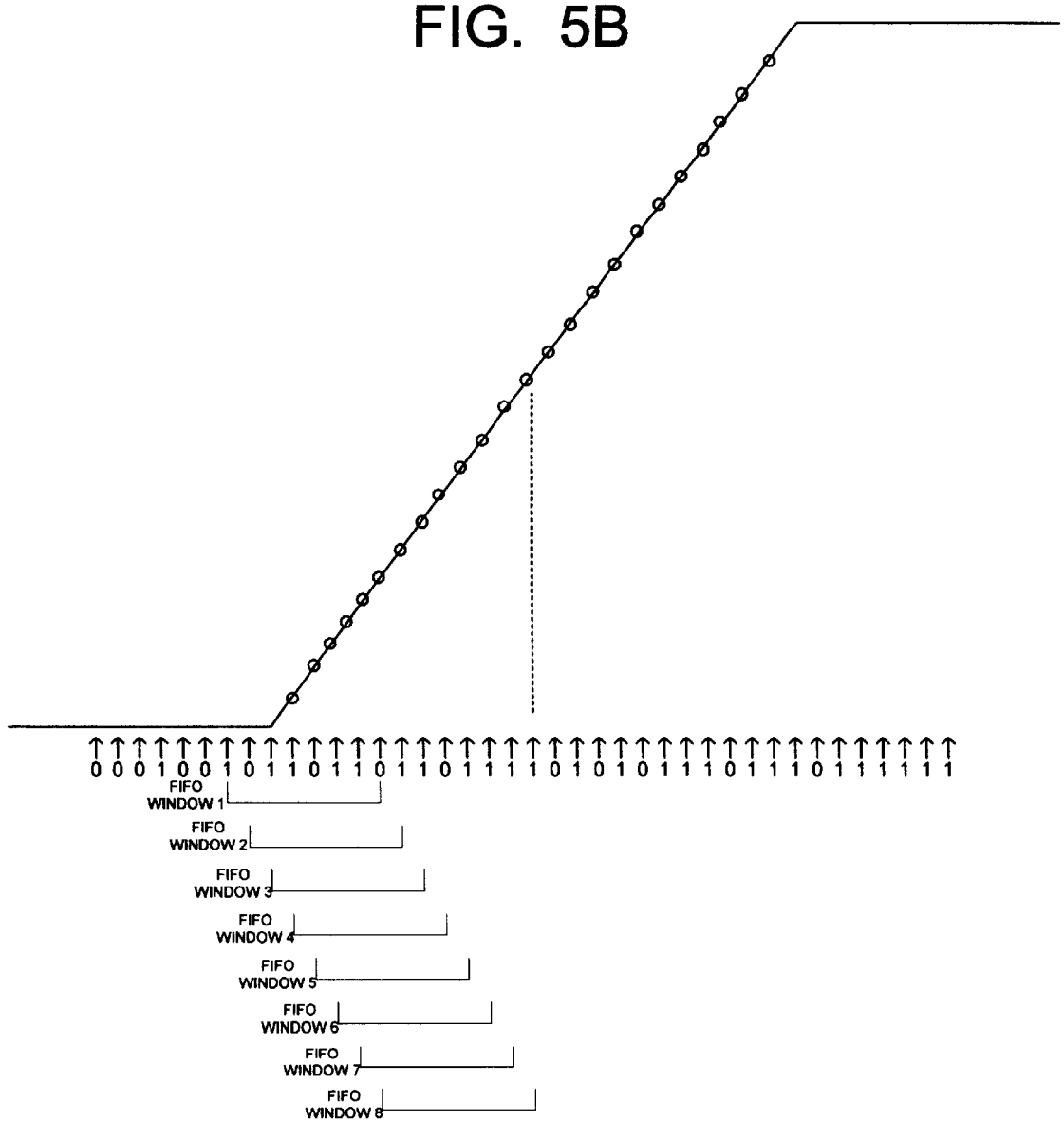

During operation, edge detection of the respective incident and reflected edges is accomplished by the operation of the real-time results processor 50. Generally, as shown in FIGS. 5A and 5B, the processor acquires sampled data from the TDR'ed waveform at, for example only, one-picosecond increments to allow a real-time statistical analysis of where the edge lies. Due to metastability, or jitter, involved with, for example the set-up time of the comparator 32, the data acquisition process provides a highly accurate way of determining the edge. The user defines criteria that statistically indicates the presense of an edge, such as four logical highs in a row (from the 1 picosecond increment data stream). The criteria is used by the controller 72 to monitor the ALU 68 and accumulator output 70. This is done generally by looking at the data strewn through the FIFO 66 in respective "windows." With a FIFO eight locations deep, an incrementing window of eight locations is available for monitoring (shown in FIG. 5B). Once the criteria is satisfied, the edge may be considered "detected."

Simultaneous to the data acquisition, the one-picosecond incremental steps are counted by the strobe counter 80 to indicate where, in time, the edge lies with respect to a reference point. The count is then determined and stored in the registers 78 when the processor criteria is satisfied (when the predetermined number of steps in a row=logical high).

In an effort to maximize the accuracy of the detected edge, yet minimize the memory, several "searches" of the edge location are performed in an effort to average the counts. A running sum of the "counts" from each search is maintained in the sum location SUM, along with the minimum and maximum count values in the respective locations MIN and MAX. An average is then calculated, with the high and low values thrown out. This is but one example of a suitable low-overhead algorithm to determine the edge location for implementation with the real time results processor.

When implementing the TDR method described above, optimum results are achieved by sending out an incident waveform (rising edge), allowing the waveform to reflect from the open end of the transmission line, and letting the reflection settle out to around ten round trips. Then, send out a falling edge, and let the edge reflect. Again allowing the edge reflection time to settle out. If a TDR with the falling edge wont be carried out, the settling time for the incident edge may be reduced to a single round trip.

For automatic test equipment that employs a thousand channels or more, the TDR method described above allows for real-time processing of timing measurement data for multiple channels in parallel. This greatly reduces the data acquisition time, and correspondingly reducing the process time to carry out timing calibrations.

Figure 7:
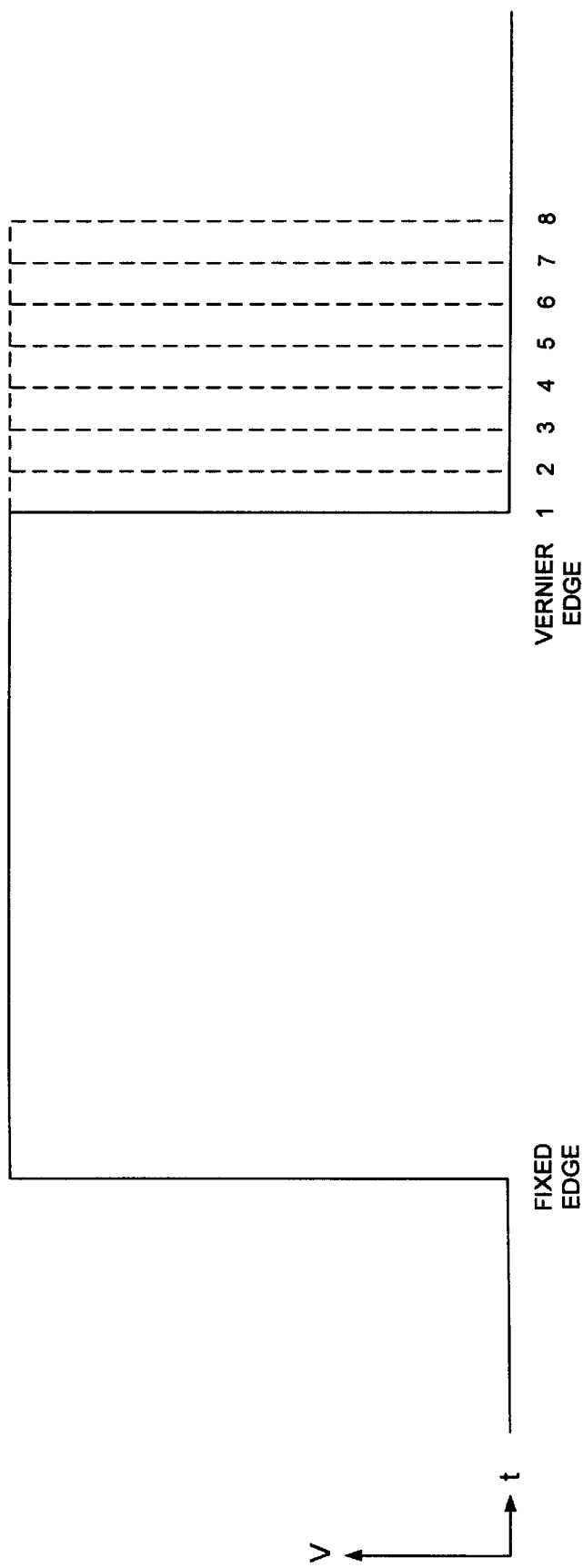
FIG. 7 is a graphical illustration showing the operation of the timing measurement unit hardware during vernier linearization data collection.

Referring now to FIG. 7, the timing measurement unit 40 is also useful for acquiring timing linearity measurements with high accuracy. Generally, the method involves capturing edge data from a plurality of timing vernier steps, and determining the relative times between each step in an effort to characterize the vernier over a range of delay values.

More specifically, and with reference to FIG. 2, data acquisition for the timing vernier linearization method is carried out by selecting a vernier setting with the vernier selector 47 and feeding the verniered edge to the first flip-flop 48. The combined fixed rising edge and the verniered falling edge are output to the second flip-flop 49, then passed through the second selector 45 responsive to a linearization mode signal. The pulse is fed through the output flip-flop 46 and on to the input circuitry 52 of the real-time results processor 50.

The real time results processor detects the verniered edge in much the same manner as the TDR application and processes the actual edge timing with respect to the fixed rising edge reference. Subsequent falling edges are generated, as shown in FIG. 7, according to incremental vernier settings, measured and stored according to the above method. The data may then be further analyzed to characterize the actual vernier delays in response to the changing settings. Any non-linearities can then be compensated for by the tester through known calibration procedures.

Of course, since each tester channel employs its own hardware to carry out the timing linearity measurements as described above, all of the tester channels can perform the linearization measurements in parallel, significantly minimizing data collection time.

Those skilled in the art will appreciate the many benefits and advantages afforded by the present invention. Of particular importance are the real-time parallel processing capabilities that allow the timing measurements for multiple channels to be carried out simultaneously. Moreover, by taking advantage of the "beat frequency" theory, highly accurate data collection is realized, contributing significantly to the high degree of accuracy obtainable for high speed and high accuracy semiconductor test operations.

While the invention has been particularly shown and described with reference to the preferred embodiments thereof, it will be understood by those skilled in the art that various changes in form and detail may be made therein without departing from the spirit and scope of the invention. For example, while registers have been described for storing the output of the ALU, it is within the scope of the invention to implement a memory for carrying out the storage function.

What is claimed is:

1. Automatic test equipment for testing a semiconductor device, said automatic test equipment including:
   a computer workstation;
   pin electronics circuitry coupled between said semiconductor device and said computer workstation, said pin electronics circuitry including a plurality of channels, each channel including
   timing circuitry operative in response to desired programmed timing information,
   driver/comparator circuitry coupled to said timing circuitry for driving test waveforms at a first waveform period, and sampling data from said waveforms at a second waveform period, the first and second waveform periods having edges that periodically coincide to define a beat period, and a timing measurement unit coupled to said driver/comparator circuitry for measuring the relative timings of said sampled data, said plurality of channels cooperating to produce timing measurement data in parallel.

2. Automatic test equipment according to claim 1, wherein the timing measurement unit includes a processor, and the processor includes:

input circuitry having a clock input adapted for receiving a beat clock signal having said beat period for receiving a stream of data sampled from said test waveforms at said beat period; a data filter coupled to said input circuitry and including logic responsive to preprogrammed criteria to extract data indicative of a timing event;

a counter having an input coupled to said beat clock and operative to count said data values and generate a count representative of the timing of said extracted timing event data with respect to a predetermined reference count, the counter having a rollover input set to roll the counter over at a rate corresponding to the beat period; and memory for storing said count.

3. A real-time results processor for implementation in a semiconductor tester pin electronics channel for detecting actual timing data relating to test waveforms generated by a semiconductor tester, said real time results Processor including:

input circuitry having a clock input for receiving a stream of data sampled from said test waveforms;

a data filter coupled to said input circuitry and including logic responsive to preprogrammed criteria to extract data indicative of a timing event;

a counter operative to count said data values and generate a count representative of the timing of said extracted timing event data, the counter including a rollover input set to roll the counter over according to the clock input; and storage circuitry for storing said count.

4. Automatic test equipment according to claim 3 wherein:

said storage circuitry comprises a plurality of registers for storing selected data values.

5. Automatic test equipment according to claim 3 wherein said input circuitry includes a decimator clocked by a programmable divider to remove superfluous data from said stream of data.

6. Automatic test equipment according to claim 3 wherein said data filter includes a FIFO of a programmable depth to define a data window, and said logic comprises an arithmetic logic unit having an input coupled to the output of said FIFO.

7. A method of determining the length of a transmission line, said method including the steps of:

driving a periodic waveform of a predetermined magnitude along said transmission line at a predetermined waveform period to generate a periodic sequence of incidence edges and reflected edges;

setting a comparator detection threshold at a specified level to detect said incidence edges;

strobing said waveform at a strobe period, said strobe period and waveform period having edges that periodically coincide to define a beat period;

establishing a timing reference point on said waveform;

detecting one of said incidence edges at an incidence edge detection point in a first search and recording a count of the number of strobes from said timing reference point to said incidence edge detection point;

resetting said count at said beat period rate to maintain said timing reference point;

detecting said reflected edge in a subsequent search and recording a count of the number of strobes from said timing reference point to said reflected edge detection point; and evaluating the relative counts between said incidence edge detection point and said reflected edge detection point to determine the length of said transmission line.

8. A method according to claim 7 wherein said detecting steps each include the steps of:

processing a data stream of logical data values generated by said comparator strobe period;

establishing a statistical criteria for said data stream representing where said incidence/reflected edge lies; and identifying said edge when said criteria is satisfied.

9. A method according to claim 8 wherein said processing step includes the step of filtering said logical data values.

10. A method according to claim 7 wherein said evaluating step includes the step of averaging of a plurality of searches to identify said incidence edge detection point and said reflected edge detection point.

11. A method of determining, in parallel, the Pulse widths for a plurality of periodic tester waveforms generated by a plurality of tester channels, each of said channels simultaneously carrying out the steps of:

driving a fixed reference rising edge at a predetermined period;

selecting a first timing vernier step delay to generate a falling edge waveform;

combining said fixed reference rising edge and said falling edge to generate a first desired pulse width;

detecting the actual pulse width;

repeating said driving, selecting, combining and detecting steps with subsequent vernier settings to generate detected pulse width data; and characterizing said timing vernier with said detected pulse width data.

12. A method according to claim 11 wherein said detecting step includes the step of:

sampling data from said falling edge waveform at a sampling rate having a sampling period different than the predetermined period.

* * * * *